United States Patent [19]
Andaleon et al.

[11] Patent Number: 5,291,496
[45] Date of Patent: Mar. 1, 1994

[54] FAULT-TOLERANT CORRECTOR/DETECTOR CHIP FOR HIGH-SPEED DATA PROCESSING

[75] Inventors: David D. Andaleon, San Ramon; Leonard M. Napolitano, Jr., Danville; G. Robert Redinbo, Davis, all of Calif.; William O. Shreeve, Fayetteville, N.Y.

[73] Assignee: The United States of America as represented by the United States Department of Energy, Washington, D.C.

[21] Appl. No.: 599,606

[22] Filed: Oct. 18, 1990

[51] Int. Cl.$^5$ .................. G06F 11/10; G06F 11/16; H03M 13/00
[52] U.S. Cl. ...................................... 371/3; 371/37.6
[58] Field of Search .................. 371/37.1, 3, 37.6

[56] References Cited

U.S. PATENT DOCUMENTS

| | | | |
|---|---|---|---|
| 4,371,930 | 2/1983 | Kim | 364/200 |
| 4,410,989 | 10/1983 | Berlekamp | 371/39.1 |
| 4,455,655 | 6/1984 | Galen et al. | 371/37.7 |
| 4,476,562 | 10/1984 | Sako et al. | 371/39 |
| 4,633,470 | 12/1986 | Welch et al. | 371/37 |
| 4,637,021 | 1/1987 | Shenton | 371/37 |
| 4,683,572 | 7/1987 | Baggen et al. | 371/37 |
| 4,730,321 | 3/1988 | Machado | 371/38 |
| 4,777,635 | 10/1988 | Glover | 371/37.5 |
| 4,782,490 | 11/1988 | Tenengolts | 371/40 |
| 4,823,181 | 4/1989 | Mohsen et al. | 357/51 |
| 4,827,478 | 5/1989 | Chan | 371/40.1 |
| 4,868,827 | 9/1989 | Yamada et al. | 371/37.5 |

OTHER PUBLICATIONS

Berlekamp, E., "Bit-Serial Reed-Solomon Encoders", *IEEE Transactions on Information Theory*, vol. IT-28, No. 6, Nov. '82, pp. 869-874.

Adi, W., "Fast Burst Error-Correction Scheme with Fire Code", *IEEE Transactions on Computers*, vol. C-33, No. 7, Jul. 1984, pp. 613-618.

N. Demassieux et al., "A 10 MHz (255,223) Reed-Solomon Decoder", *Proceedings of the IEEE 1988 Custom Integrated Circuits Conference*, May 16-19, 1988.

T. Rao et al., Error-Control Coding For Computer Systems, Englewood Cliffs, N.J., Prentice Hall 1989, Sections 5.1-5.2, pp. 222-261.

M. Blaum et al., "On t-Error Correcting/All Unidirectional Error Detecting Codes", IEEE Transactions On Computers, vol. C-38, No. 11, Nov. 1989, pp. 1493-1501.

(List continued on next page.)

*Primary Examiner*—Stephen M. Baker
*Attorney, Agent, or Firm*—Karuna Ojanen; James H. Chafin; William R. Moser

[57] ABSTRACT

An internally fault-tolerant data error detection and correction integrated circuit device (10) and a method of operating same. The device functions as a bidirectional data buffer between a 32-bit data processor and the remainder of a data processing system and provides a 32-bit datum is provided with a relatively short eight bits of data-protecting parity. The 32-bits of data by eight bits of parity is partitioned into eight 4-bit nibbles and two 4-bit nibbles, respectively. For data flowing towards the processor the data and parity nibbles are checked in parallel and in a single operation employing a dual orthogonal basis technique. The dual orthogonal basis increase the efficiency of the implementation. Any one of ten (eight data, two parity) nibbles are correctable if erroneous, or two different erroneous nibbles are detectable. For data flowing away from the processor the appropriate parity nibble values are calculated and transmitted to the system along with the data. The device regenerates parity values for data flowing in either direction and compares regenerated to generated parity with a totally self-checking equality checker. As such, the device is self-validating and enabled to both detect and indicate an occurrence of an internal failure. A generalization of the device to protect 64-bit data with 16-bit parity to protect against byte-wide errors is also presented.

24 Claims, 7 Drawing Sheets

OTHER PUBLICATIONS

L. Dunning et al., "Unidirectional Byte Error Detecting Codes for Computer Memory System", IEEE Transactions On Computers, vol. C-39, No. 4, Apr. 1990, pp. 592-595.

D. Tao et al., "An Efficient Class of Unidirectional Error Detecting Correcting Codes", IEEE Transactions On Computers, vol. C-37, No. 7, Jul. 1988, pp. 879-882.

L. Dunning et al., "Unidirectional 9-Bit Byte Error Detecting Codes for Computer Memory Systems", Proceedings of the Nineteenth Intern. Symposium on Fault-Tolerant Computing, Jun. 1989, pp. 216-221.

V. Hamacher et al., Computer Organization, Chapter 11-Risc Processors, Third Edition, New York, McGraw-Hill, 1990, pp. 427-459.

D. Patterson et al., Computer Architecture: A Quantitative Approach, San Mateo, CA: Morgan Kaufman, 1990, Sections 6.1-6.4, pp. 251-278.

D. Bossen, "b-Adjacent Error Correction", IBM Journal of Research and Development, vol. 14, No. 4, pp. 341-474, Jul. 1970.

S. Hong et al., "A General Class of Maximal Codes for Computer Applications", IEEE Transactions on Computers, vol. C-21, No. 12, Dec. 1972, pp. 1322-1331.

W. Peterson et al., Error Correcting Codes, Second Edition, Cambridge: MIT Press, 1972, Section 3.9, pp. 70-73.

S. Lin et al., Error Control Coding Fundamentals and Applications, Englewood Cliffs, N.J.: Prentice Hall, 1983, Section 6.5, pp. 170-177.

R. McElice, Finite Fields for Computer Scientists and Engineers, Boston: Kluwer Academic Publishers, 1987, Chapter 8, pp. 97-118.

B. Johnson, Design and Analysis of Fault-Tolerant Digital Systems, Reading, Mass., Addison-Wesley, 1989, Sections 4.2-4.3.1, pp. 170-193.

G. Redinbo, "Fault-Tolerant Decoders for Cyclic Error-Correcting Codes", IEEE Transactions on Computers, vol. C-36, No. 1, Jan. 1987, pp. 47-63.

D. Pradhan, Fault-Tolerant Computing Theory and Techniques, vol. 1, Englewood Cliffs, N.J., Prentice-Hall, 1986, Sections 5.5-5.6, pp. 382-397.

J. Wakerley, Error Detecting Codes, Self-Checking Circuits and Applications, New York: North Holland 1978, Chapter 7, pp. 156-173.

A. Gamal et al. "An Architecture for Electrically Configurable Gate Arrays", IEEE Journal of Solid-State Circuits, vol. 24, No. 2, Apr. 1989, pp. 394-398.

FAULT-TOLERANT CORRECTOR/DETECTOR CHIP FOR HIGH-SPEED DATA PROCESSING

GOVERNMENT RIGHTS IN INVENTION

The United States Government has rights in this invention pursuant to Contract No. DE-AC04-76DP00789 between the Department of Energy and the American Telephone and Telegraph Company.

FIELD OF THE INVENTION

This invention relates generally to data processing apparatus and method and, in particular, to an internally fault-tolerant data error detection and correction integrated circuit device and to a method of operating same.

BACKGROUND OF THE INVENTION

Several commercially available data error correction and detection devices have been developed to protect 32-bit data paths. Exemplary thereof is a device manufactured by Texas Instruments Inc. designated as a TI 74AS634, and a device manufactured by American Microdevices, Inc. designated as an AMD 2960. These prior art devices append seven parity bits to each 32-bit datum to provide single-bit error correction and double-bit error detection capabilities (SEC/DED). The combination of data and parity forms a (39,32) systematic code where 39 bits is a total width required for the expanded data path. This type of protection provides satisfactory coverage for independently occurring random bit errors. However, faults in digital systems can overwhelm this protection level. For example, for an integrated circuit chip failure, sometimes referred to as a "chip kill", the number of errors may involve all of the data lines passing through the particular failed chip.

Known in the art of error detection and correction are Reed-Solomon codes. These codes are an efficient class of linear codes using multi-bit symbols that are maximum distance separable. Binary-based Reed-Solomon codes use symbols from a finite field of $2^m$, generally labeled by $GF(2^m)$ where m bits represent a field element. Two sizes of parameter m are of practical interest for present technology: $m = 4$, representing nibble symbols and $m = 8$ for byte symbols.

In U.S. Pat. No. 4,476,562, Oct. 9, 1984, Sako et al disclose correcting symbols in an audio system where serial data symbols are being processed. A Reed-Solomon code of generic multi-bit symbols (m>2) is employed having a minimum symbol distance of five symbols, permitting double error correction. Interleaving of bits is employed in one embodiment. The system of Sako et al. processes a string or series of data values and not a single 32-bit data value.

In U.S. Pat. No. 4,637,021, Jan. 13, 1987, Shenton discloses a system that uses two levels of Reed-Solomon codes, interleaving their bit positions to obtain a single byte error-correcting code. The technique requires two decoding operations and employs four check bytes. This system is intended for serial data and has a substantial delay due to de-interleaving and two level decoding.

In U.S. Pat. No. 4,683,572, Jul. 28, 1987, Baggen et al. disclose two Reed-Solomon codes, each having a minimum symbol distance of five and capable of correcting two symbol errors. The codes are interleaved to protect optical disk data having a serial format. This coding system uses soft decision flag information in the decoding process as opposed to hard decision information. Two bits of additional information are attached to each eight bit symbol and indicate to the decoder a relative confidence in the symbol being correct. Each basic code is a shortened byte correcting Reed-Solomon code using four check symbols. The equivalent binary view of each code is 128 bits with 96 information bits.

In U.S. Pat. No. 4,730,321, Mar. 8, 1988, Machado discloses a decoder implemented in a dedicated microprocessor. An associated algorithm employs three shortened Reed-Solomon codes with byte-wide symbols. Two different shortened versions of a byte protecting Reed-Solomon code are involved. Each code has four parity symbols and can correct two symbol errors. Interleaving the three codes is employed in protecting data originating from a rotating disk storage system. The implementation emphasizes simple syndrome calculation circuitry which is coupled to the microprocessor. However, the decoder operates sequentially because of the microprocessor-based decoder. The overall code length after interleaving is 524 symbols.

In U.S. Pat. No. 4,782,490, Nov. 1, 1988, Tenengolts discloses two Reed-Solomon codes employed with interleaving where each code is byte-symbol based. The role of one of the codes is verification of correction performed by the other. The other code is double-byte-correcting and operates on incoming serial data. The basic block size of the data can be changed. Even though the one code is capable of double symbol correction, only single byte error correction is used.

In U.S. Pat. No. 4,868,827, Sep. 19, 1989, Yamada et al. describe a general byte correcting Reed-Solomon code for PCM communication data. The code employed is shortened to 61 symbols which, when viewed over the binary field, is quite long (488 bits). The system handles data serially and employs a standard decoding method. This system is capable of correcting two byte errors in 61 symbols.

In U.S Pat. No. 4,633,470, Dec. 30, 1986, Welch et al. present an advanced theory of decoding serial data protected by a Reed-Solomon code and describe a method for decoding general Reed-Solomon codes over any field without explicitly calculating the syndromes. Serial data is processed by an iterative algorithm having a variable delay. A significant portion of the decoding algorithm implements the Lagrange interpolation formula from classic mathematical theory. Furthermore, this system employs an iterative process and not a direct calculation of values.

In U.S. Pat. No. 4,371,390, Feb. 1, 1983, D. R. Kim discloses the logging of permanent errors in a memory system for correcting single bit errors. This system operates on parallel bits, not on symbols in parallel.

In a journal article entitled "A 10 MHz (255,223) Reed-Solomon Decoder", Proc. IEEE 1988 Custom Integrated Circuits Conference, paper 17.6, May 16-19, 1988, Demassieux et al. describe an implementation of a 16 symbol error-correcting decoder for byte-width symbols. The system treats the data serially. The decoder uses standard sequential Euclidian algorithm techniques to find error location.

All of the above described prior art processes a string or series of data values, and not a single 32-bit data value. These prior art systems also do not encode parity, are unidirectional, and are not internally fault tolerant.

Many of these references deal with the serial use of Reed-Solomon codes and do not have a parallel error-correcting feature wherein all data and parity lines are sensed simultaneously and wherein any error is corrected immediately. As such, these references experience a variable decoding delay due to the sequential nature of their underlying algorithms.

Furthermore, the number of parity positions required by these references is substantial. While additional parity positions may increase the error-correcting or error-detecting capabilities for longer serial data strings, for a 32-bit datum a shortened code that meets the maximum error performance bound for linear codes is preferable.

It is therefore one object of the invention to provide an error detection and correction integrated circuit device that employs a relatively short parity code, as compared to the prior art, while meeting a maximum error performance bound for linear codes for a 32-bit datum.

Also, none of these references teach systems that are internally fault-tolerant. This important attribute ensures that any single subsystem failure in the encoding/decoding device is signalled externally so as to prevent the processing of erroneous data.

It is therefore another object of the invention to provide an error detection and correction integrated circuit device that is internally fault tolerant.

SUMMARY OF THE INVENTION

The foregoing problems are overcome and the objects of the invention are realized by an internally fault tolerant data error detection and correction integrated circuit device and a method of operating same. In a preferred embodiment of the invention the device is optimized for 32-bit wide data processing applications. The device functions as a bidirectional data buffer between a 32-bit data processor and the remainder of a data processing system and provides a 32-bit datum is with a relatively short eight bits of data-protecting parity. The 32-bits of data by eight bits of parity is partitioned into eight 4-bit nibbles and two 4-bit nibbles, respectively. For data flowing towards the processor the data and parity nibbles are checked in parallel and in a single operation employing a finite field dual orthogonal basis technique. Any one of ten (eight data, two parity) nibbles are correctable if erroneous, or two different erroneous nibbles are detectable. For data flowing away from the processor the appropriate parity nibble values are calculated and transmitted to the system along with the data. The device regenerates parity values for data flowing in either direction and compares regenerated to generated parity with a totally self-checking equality checker. As such, the device is self-validating and enabled to both detect and indicate an occurrence of an internal failure.

BRIEF DESCRIPTION OF THE DRAWING

The above set forth and other features of the invention are made more apparent in the ensuing Detailed Description of the Invention when read in conjunction with the attached Drawing, wherein:

FIG. 3a is a simplified block diagram showing a general case of the error corrector subassembly of FIG. 1;

FIG. 3b is a block diagram showing in greater detail a single one of the bitwise correctors employed in FIG. 3a;

FIG. 4 illustrates in greater detail an implementation of an error locator function shown in FIG. 3a.

DETAILED DESCRIPTION OF A PREFERRED EMBODIMENT OF THE INVENTION

Figure 1:
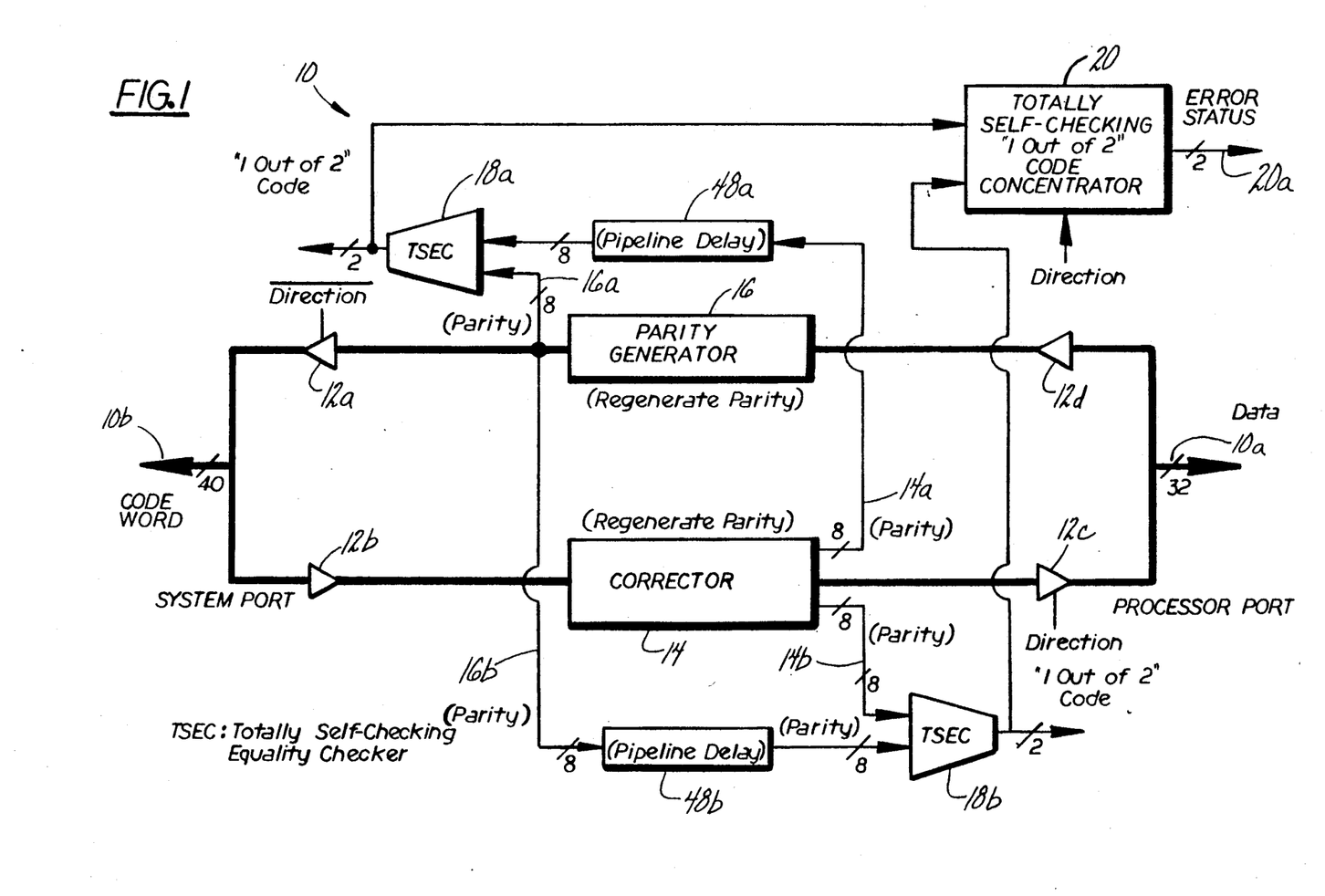
FIG. 1 is a block diagram of an error detection and correction device showing primary data and parity paths.

FIG. 1 illustrates in block diagram form an embodiment of an error detection and correction device 10 constructed and operated in accordance with the invention. Device 10 is bidirectionally coupled at a processor port 10a to a data bus of a 32-bit data processor (not shown). Device 10 is also bidirectionally coupled at a system port 10b to a data bus of a data processing system. The system data bus is typically coupled to memory and I/O peripheral devices (not shown). A first internal data path passes through an error detector/corrector 14 that detects and corrects erroneous bits received from the system port 10b, the correction being based upon associated parity bits. These parity bits are initially generated by a parity generator 16 that is disposed within a second internal data path; this path being sourced by the data processor. In accordance with an aspect of the invention both the corrector 14 and parity generator 16 are enabled to regenerate parity as part of an internal fault-tolerance function. Operating in support of the fault-tolerance function are a pair of totally self-checking equality checkers (TSECs) 18a and 18b that provide inputs to a totally self-checking "1 out of 2" code concentrator 20. Concentrator 20 provides to external circuitry an output that is expressive of an error status of the device 10. As such, the device 10 operates to self-validate both parity encoding and decoding operations.

In order to gain an understanding of the functioning of these various units a detailed description of a shortened Reed-Solomon code, as implemented to achieve the functionality of the device 10, is now provided.

A Reed-Solomon code over $GF(2^m)$ has a fundamental length of $(2^m-1)$, m-bit symbols, and the minimum symbol distance is determined by the number of parity symbols assigned within this length. If the code carries K information symbols, leaving $(2^m-1-K)$ parity symbols, the minimum distance is $(2^m-K)$. A single symbol correcting code requires a minimum distance of three, translating into a requirement of two parity symbols. Hence a nibble correcting code, $m = 4$, has basic length of 15 including the two 4-bit parity symbols, while a byte correcting version (m=8) has a length of 255.

A Reed-Solomon code word may be written as a vector with components $GF(2^m)$ or, as is more conventional, may be expressed as a polynomial in an indeterminant, say Y. V(Y) represents a code word where individual symbols are denoted by $\{V_i\}$ coefficients.

$$V(Y) = V_0 + V_1 Y + V_2 Y^2 + \ldots V_{N-1} Y^{N-1}; \quad (1)$$

$N = 2^m - 1$
$V_i \epsilon GF(2^m)$
$i = 0, 1, \ldots, N - 1$

One property of a cyclic code implies that the symbol's indices and the indeterminants exponents may be treated as integers reduced modulo N. In particular, this means that a negative index i, $-N \leq i < 0$, is equivalent to the positive index $N+i$.

This polynomial approach to code words is helpful in establishing the relationships between the information symbol positions and the corresponding parity positions. A fundamental definition of a Reed-Solomon code requires that roots of a code polynomial must include the consecutive powers of a primitive finite field element spanning at least the number of parity positions. A primitive root in the finite field will be denoted henceforth by $\alpha$. For a code with two parity symbols and having a single m-bit symbol correcting capability a convenient choice for these consecutive roots is $\alpha^0 = 1$ and $\alpha^1 = \alpha$. Furthermore, the two parity symbol positions can be taken as indexed by 0 and 1, although any other two consecutive positions can be chosen. The data symbol positions will be denoted by letters $D_i$ while $P_0$ and $P_1$ will designate the two parity symbols in a generic code polynomial C(Y).

$$C(Y) = P_0 + P_1 Y + D_2 Y^2 + D_3 Y^3 + \ldots + D_{N-1} Y^{N-1}; \quad (2)$$

$D_i$ DATA SYMBOLS
$P_0, P_1$ PARITY SYMBOLS

This is a systematic code representation wherein the data symbols are conspicuously identifiable. The two equations dictating the parity values are obtained from the previously mentioned requirement that and $\alpha^0$ and $\alpha^1$ be roots of C(Y).

$$C(\alpha^0) = 0 \text{ AND } C(\alpha^1) = 0 \text{ PARITY REQUIREMENTS} \quad (3)$$

Coupling equations (2) and (3) demonstrates that the two homogeneous equations are linear in parity symbols $P_0$ and $P_1$.

It is known that a code can be shortened without degrading the code's minimum distance property. The shortening operation is equivalent to selecting certain data positions as always being fixed at zero. The parity equations (3) are obviously linear in any individual data symbol and thus a permanently zero position has no influence on either parity value. These zero positions are effectively removed from algebraic consideration, thereby advantageously permanently shortening the code. Permanent zero data symbol positions carry no weight and can never contain an error. For computer applications, the two shortened Reed-Solomon codes of practical interest have an abbreviated length of 10 m-bit symbols, including their two parity symbols. In terms of binary positions, the nibble based code (m = 4) is 40 bits long with 32 data bits; the similar byte-type code (m = 8) is 80 bits long including 64 data bits. However, in either case, the groups of bits defining the representative m-bit symbols are fixed in advance and any error correction or detection operations are with respect to these symbol boundaries.

Regardless of whether the code is shortened, any errors in the observed code word can be modeled as additive and described concisely by using a polynomial R(Y) to represent the observed symbols R(Y) is defined to be a sum of the true code polynomial C(Y) and an error polynomial E(Y), all viewed as polynomials with symbols from $GF(2^m)$:

$$R(Y) C(Y) + E(Y). \quad (4)$$

The effects of errors are concentrated into two syndromes by substituting $\alpha^0$ and $\alpha^1$ into equation (4) since C(Y) contains these elements as roots:

$$S_0 = R(\alpha^0 = 1) = E(\alpha^0 = 1) \text{ and } S_1 = R(\alpha^1) = E(\alpha^1). \quad (5)$$

The distance profile of the code guarantees that all double symbol errors cause at least one syndrome value to be nonzero, thus detecting such an error. When a single symbol error occurs at symbol position $v$ and has value $E_v$ (an element in $GF(2^m)$), the corresponding syndromes include the error value and the position value:

$$S_0 = E_v; S_1 = E_v \alpha^v. \quad (6)$$

The error location number, $\alpha^v$, may be isolated from $S_1$ by inverting $S_0$ to eliminate the effects of $E_v$:

$$S_0^{-1} S_1 = \alpha^v \quad (7)$$

Figures 3A, 3B:
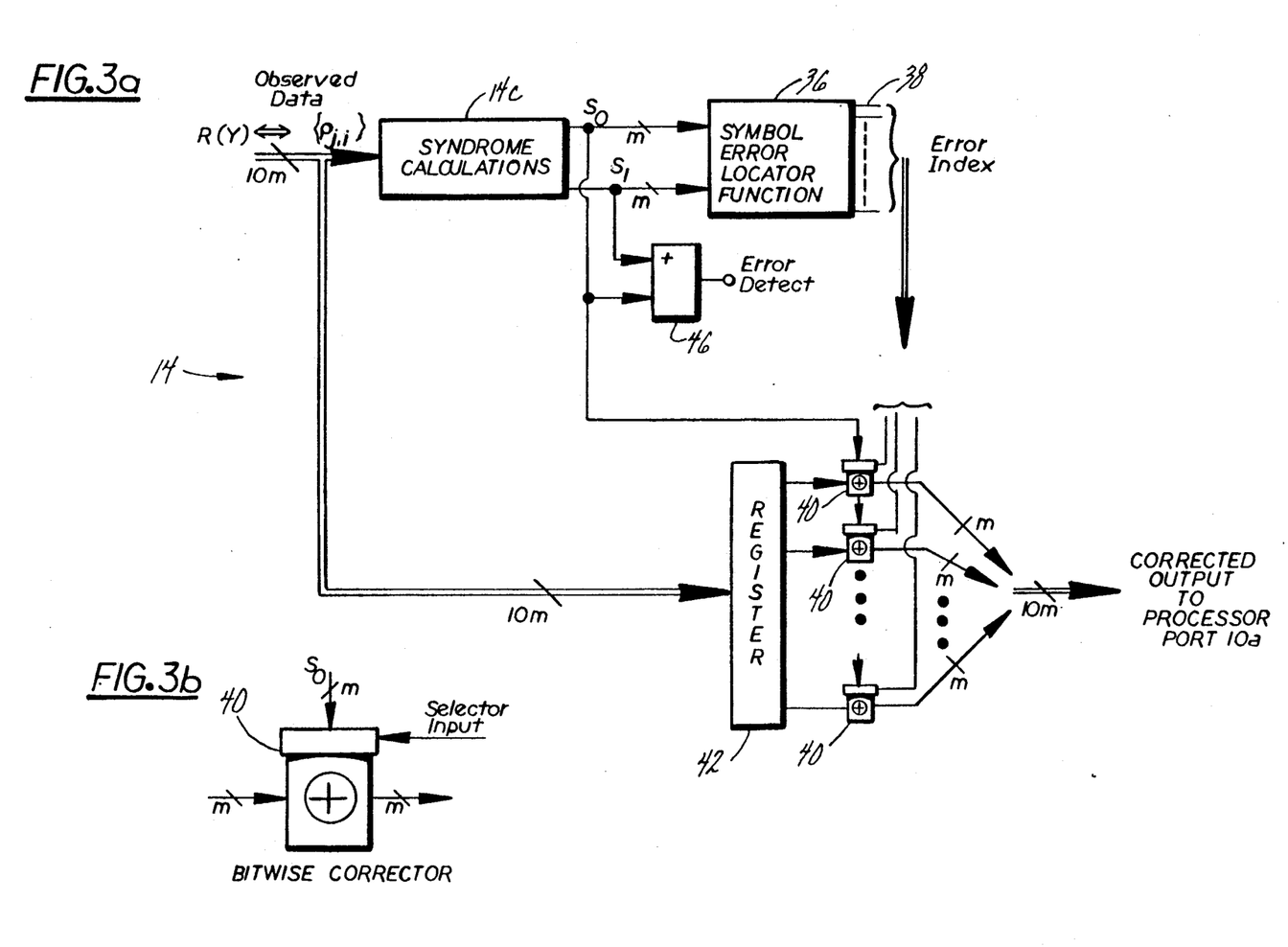
Figure 3C:
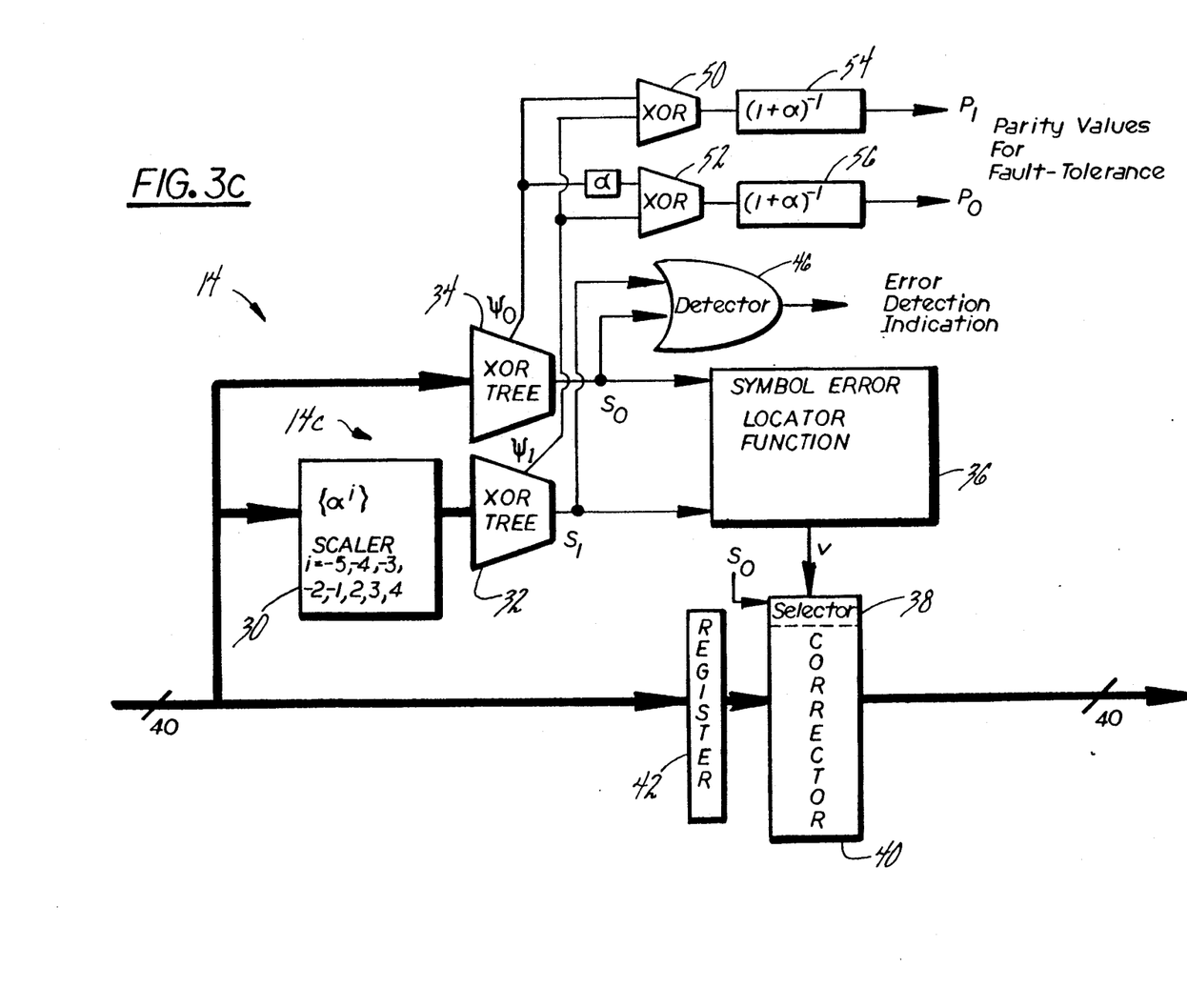
FIG. 3c is a block diagram, partially in schematic form, showing in greater detail, for a 32-bit implementation, the syndrome calculation block of FIG. 3a and also the generation of parity values for fault-tolerance checking.

An operation analogous to a logarithm, written symbolically as $\log_\alpha (\ )$ in FIG. 3c, may be applied to $S_0^{-1} S_1$ causing the error pointer $v$ to emerge.

$$v = \log_\alpha(S_0^{-1} S_1). \quad (8)$$

The steps representing Equations (7) and (8) can be condensed into a single complex functional module.

There is now described Reed-Solomon encoding and decoding employing a finite field dual orthogonal basis technique, which is another aspect of the invention.

Correcting symbol errors involves computations concerning the syndromes as in equation (6). This depends on the computational aspects of finite field operations in the binary extension field $GF(2^m)$. It is thus necessary to gain an operational understanding of the finite field manipulations. Of course, the decoding and encoding processes are implemented by Boolean operations. Nevertheless, a vector space view of the representation of finite field elements is usefully employed by two functions of the device 10. One such function is the computation of the syndromes while the other function is in the selection of the error location. These aspects of decoder 10 are described in detail below.

Finite field addition and multiplication in $GF(2^m)$ is governed by a primitive binary polynomial in another indeterminant x, f(x). The degree of this polynomial is m, the dimension of a binary vector space view of the field as well. Furthermore, the primitive element $\alpha$ used above is a root of this polynomial in the extension field $GF(2^m)$ it generates. Firstly, finite field elements may be viewed and manipulated as binary polynomials of degree $(m-1)$ or less, it being remembered that a degree $(m-1)$ polynomial requires m coefficients. Elements are manipulated as polynomials and the result of any operation that yields a polynomial of degree m or larger is divided by f(x) and the remainder is retained as the final answer. Thus, multiplying two finite field symbols is achieved by first performing polynomial multiplication of the respective binary polynomial representatives followed by retaining the remainder after dividing this intermediate, possibly much longer, polynomial by f(x). However, since polynomial addition never leads to a longer polynomial, finite field symbol addition is equivalent to a component-wise exclusive-or of the respective bit positions.

The binary based finite field $GF(2^m)$ can be viewed as a vector space over the binary field when only addition and scaling vectors by binary elements are considered. In this view, one vector basis for the extension field may be given employing powers of the primitive element $\alpha$:

$$\alpha^0, \alpha^1, \alpha^2, \ldots, \alpha^{m-1}; \text{ m BASIS ELEMENTS OF } GF(2^m)$$

Hence, it is possible to express any finite field symbol from $GF(2^m)$ in terms of binary weighting factors. For example, if D is an m-bit symbol, one vector representation can be taken as the m binary values $\{\delta_i\}$ $$D = \sum_{i=0}^{m-1} \delta_i \alpha^i;\ \delta_i = 0,1$$

There are advantages in expressing the data and parity symbols using a basis different from the basis employing powers of as involved in equation (5). This new basis is denoted by GF(2m) elements $\beta_0, \beta_1, \ldots, \beta_{m-1}$. They are chosen to be orthogonal in a certain sense to the other basis $\alpha^0, \alpha^1, \ldots, \alpha^{m-1}$. The concept of orthogonality generally rests on some inner product and in the context of finite fields the product normally selected is a function called Trace. It is a linear mapping from the finite field $GF(2^m)$ into the binary field $\{0,1\}$ and is defined formally by:

$$Tr(\lambda) = \sum_{i=0}^{m-1} \lambda^{2^i};\ \lambda \epsilon GF(2^m) \tag{9}$$

Even though the additions, multiplications and power forming operations prescribed in this formula are in the extended field, the function's value is always either 0 or 1 in the binary field. The inner product between two field elements, say $\zeta$ and $\xi$, may be defined through the trace of their product.

$$(\zeta, \xi) = Tr(\zeta\xi) \text{ EXTENSION FIELD INNER PRODUCT} \tag{10}$$

The basis $\beta_0, \beta_1, \ldots, \beta_{m-1}$, which is the dual orthogonal basis to $\alpha^0, \alpha^1, \ldots, \alpha^{m-1}$, is defined through the following requirements:

$$Tr(\alpha^i \beta_j) = \begin{cases} 1 & \text{if } i = j \\ 0 & \text{if } i \neq j \end{cases}\ i,j = 0,1,\ldots m-1. \tag{11}$$

There are computational methods using vectors and matrices for readily constructing the dual orthogonal basis. However, it develops that the consequences of the dual orthogonal basis, and not its exact form, are important. One of these useful consequences is the "sifting" property. When an element b is represented in the dual orthogonal basis with weighting coefficients $\{b_j\}$, the trace function coupled with the basis elements $\alpha^0, \alpha^1, \ldots, \alpha^{m-1}$ "sifts" these coefficients out.

$$b = \sum_{j=0}^{m-1} b_j \cdot \beta_j;\ b_j \epsilon 0,1 \tag{12a}$$

$$Tr(\alpha^i b) = b_i;\ i = 0,1,\ldots, m-1 \tag{12b}$$
SIFTING PROPERTY

In accordance with an aspect of the invention the data and parity symbols in the code polynomial are expressed using the dual orthogonal basis as opposed to the usual powers of $\alpha$ one. The observed data polynomial R(Y), equation (4), now contains symbols represented in the $\{\beta_j\}$ basis. On the other hand, the syndromes $S_0$ and $S_1$, equation (5), are computed by substituting the two powers of $\alpha$, $\alpha^0 = 1$ and $\alpha^1 = \alpha$ into R(Y) and evaluating over the field $GF(2^m)$. The coefficients in R(Y), the observed data symbols $\{R_j\}$, are expressed in the dual orthogonal basis using respective binary components $(\rho_{ji})$.

$$R_j = \sum_{i=1}^{m-1} \rho_{ji} \cdot \beta_i;\ \text{OBSERVED SYMBOL } R_j \tag{13}$$

$$j = 0,1,\ldots, N-1$$

The two syndromes may be developed using a sum of binary components $(\rho_{ji})$ as follows:

$$S_0 = \sum_{j=0}^{N-1} \sum_{i=0}^{m-1} \rho_{ji}\beta_i = \sum_{i=0}^{m-1} \left( \sum_{j=0}^{N-1} \rho_{ji} \right) \beta_i \tag{14a}$$

$$S_1 = \sum_{j=0}^{N-1} \sum_{i=0}^{m-1} \rho_{ji}\beta_i \alpha^j = \sum_{i=0}^{m-1} \left( \sum_{j=0}^{N-1} \rho_{ji} \alpha^j \right) \beta_i \tag{14b}$$

Contrastingly, the values $S_0$ and $S_1$ also possess expansions employing the dual orthogonal basis.

$$S_0 = \sum_{i=0}^{m-1} \sigma_{0i}\beta_i,\ S_1 = \sum_{i=0}^{m-1} \sigma_{1i}\beta_i,\ \sigma_{0i},\sigma_{1i} = 0,1. \tag{15}$$

The expansion coefficients $\{\sigma_{ri}\}$ appearing in equations (15) can be obtained through the sifting property, equation (12b).

$$\sigma_{0i} = Tr(S_0\alpha^i) = \sum_{j=0}^{N-1} \rho_{ji} \tag{16a}$$

$$\sigma_{1i} = Tr(S_1\alpha^i) = \sum_{r=0}^{m-1} \sum_{j=0}^{N-1} \rho_{jr} Tr(\beta_r \alpha^{j+i}). \tag{16b}$$

The fact that Tr( ) is linear and binary-valued permits moving it through the summations to the inside as shown. The upper equation confirms the known formula that syndrome $S_0$ is composed of components that are the bitwise exclusive-or of the properly indexed observed data bits. In the second equation some simplification of the double summations are possible in that whenever $0 \leq i+j < m$ only one nonzero term occurs, as r is summed over its range. This observation, coupled with the concept of setting data positions to zero (items in the range on index j), denotes that a judicious choice of the shortened data positions simplifies the number of terms needed for syndrome $S_1$.

Although the Reed-Solomon code is shortened to eight data symbols the parity symbols $P_0$ and $P_1$ are preassigned to indexed positions 0 and 1. Thus, the locations of remaining nonzero positions in the code polynomial, equation (2), determine which indices j appear in the inner summation of equation (16b). It can be seen that this range of summation index j should include negative indices, in the modulo N sense. An acceptable choice for the nonzero data positions are 2, 3, 4, N−5, N−4, N−3, N−2 and N−1. These last five position indices may be viewed as negative in the sense that when they appear in the exponent of in equation (16b), they are effectively reduced modulo N because of this primitive $N^{th}$ root of unity.

$$+P_0+P_1Y+D_2Y^2+D_3Y^3+D_4Y^4 \quad (7)$$

There is now described in greater detail the shortened code polynomial that is employed by the invention. As previously noted the number of nonzero items included in the inner sums of equation (16b) is related to the nonzero values taken by $Tr(\beta_r \alpha^{j+i})$. The dual orthogonal basis sifting property, equation (12b), is useful in determining exactly which nonzero items appear. The finite field element $\alpha^{j+i}$ may be written in terms of the $\alpha$ basis. This polynomial-based representation is readily computed as follows.

$$\alpha^{j+i} = \sum_{q=0}^{m-1} a_{i+j,q}\alpha^q; \quad (18)$$

$a_{i+j,q} = 0,1$
$i,q = 0,1,\ldots,m-1$
$j = N-5, N-4, \ldots, N-1, 0, 1, \ldots, 4.$ Of course, for choices $i+j = 0,1,\ldots m-1$, there is only one nonzero coefficient $a_{i+j,q}$. The following compact form of the computation for each $\sigma_{1i}$ component of $S_1$ results:

$$\sigma_{0i} = \sum_{j=0}^{5} \sum_{r=0}^{m-1} \rho_{j,r}^a(i+N-j),r + \sum_{j=0}^{4} \sum_{r=0}^{m-1} \rho_{j,r}a_{i+j,r}; \quad (19)$$

$i = 0,1,\ldots,(m-1).$

The subscript $(i+N-j)$ is reduced modulo N.

Figure 4:
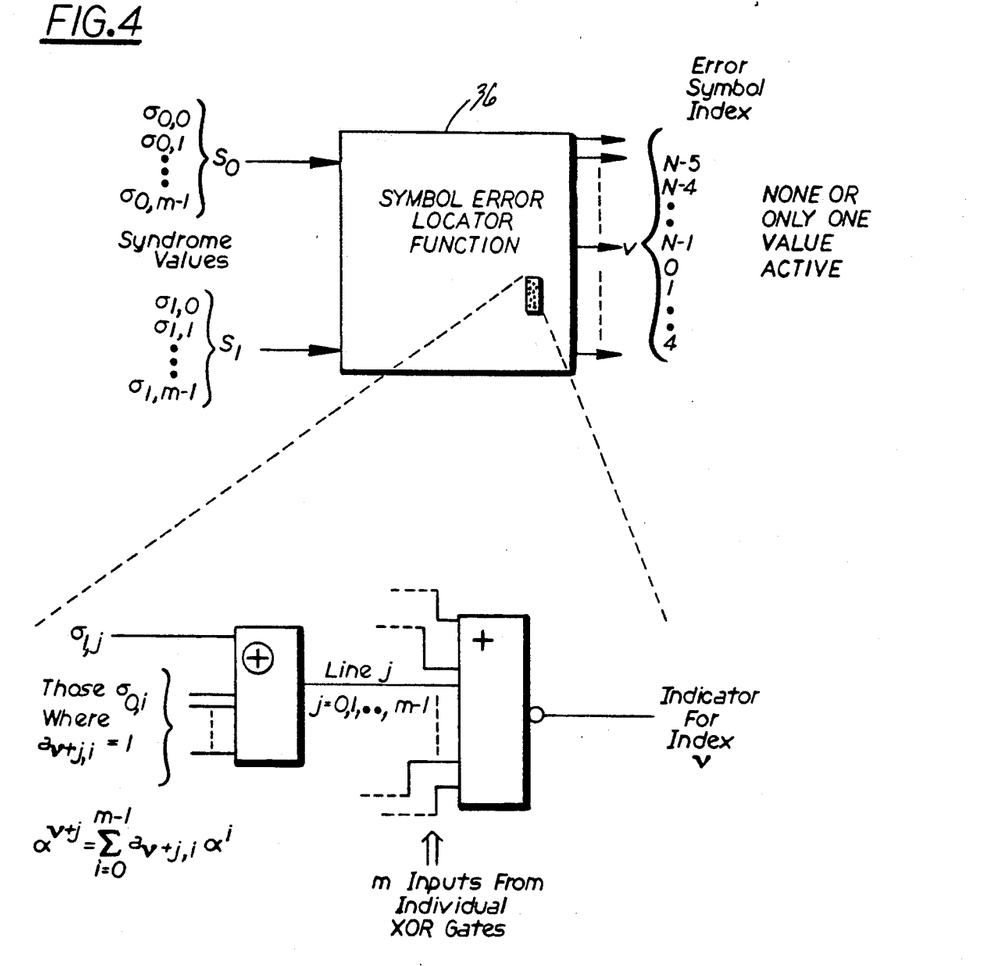
Figure 5:
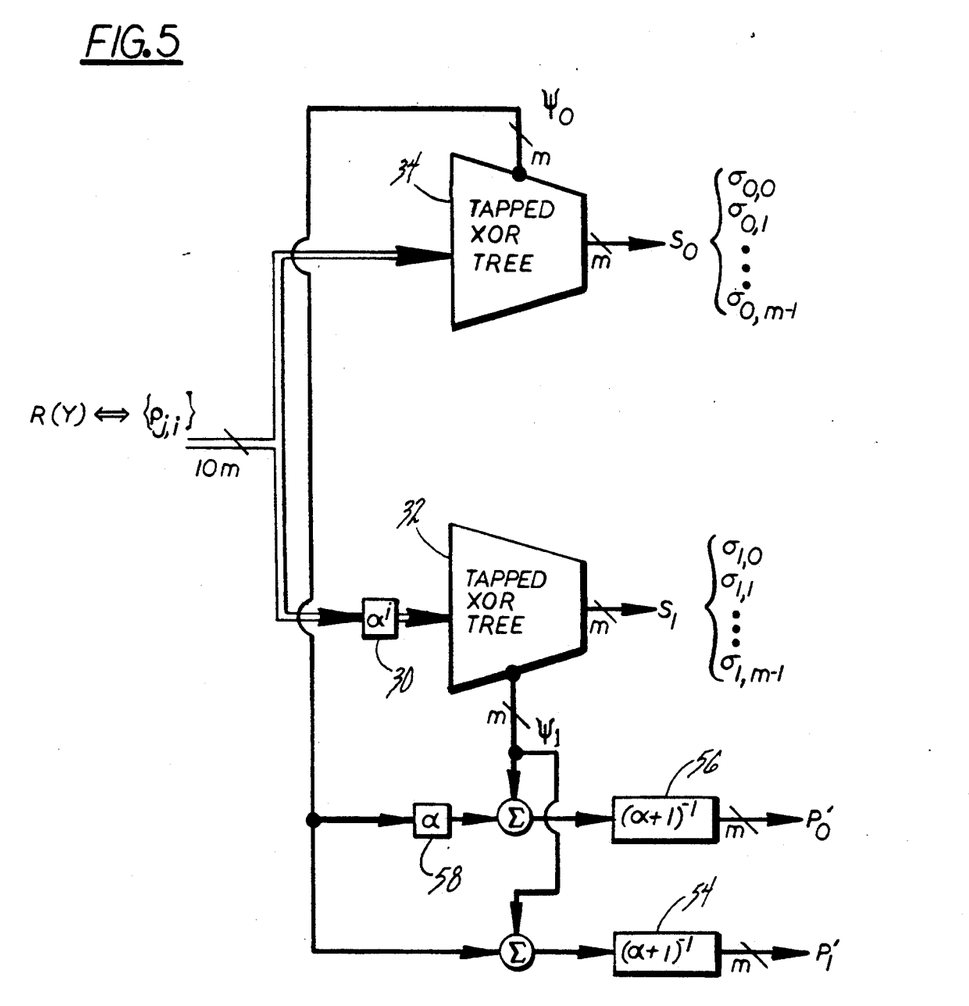
FIG. 5 illustrates an implementation of syndrome calculation and parity regeneration that employs intermediate values.

An important element of error correction is locating the single error to be corrected. This is straightforward mathematically when given the two syndromes $S_0$ and $S_1$ in that the single error value is contained in $S_0$. However, instead of implementing the inversion and logarithmic operations dictated in equation (8) and then employing a logic decoder, the system of the invention instead directly realizes a symbol error locator function. As depicted in FIGS. 4 and 5 the error locator 36 of the invention accepts two sets of m binary lines, each set representing a syndrome, and activates at most one of 10 error position index lines. The development of this locator function begins with a constraint between the syndromes when a single error at location $v$ is present, as follows.

$$S_1 = S_0\alpha^v ; v \text{ SINGLE ERROR INDEX.} \quad (20)$$

This equality establishes the relationships between the $\{\beta_j\}$ basis components $\sigma_{0i}$ and $\sigma_{1i}$ of the two syndromes according to equation (15). The sifting property of the trace with regards to the dual orthogonal basis produces the following identities:

$$\sigma_{1j} = Tr(S_1\alpha^j) = Tr(S_0\alpha^{v+j}); \quad (21)$$

-continued
$j = N-5, N-4, \ldots, N-1, 0, 1, \ldots, 4$ $$= \sum_{i=0}^{m-1} \sigma_{0i}Tr(\beta_i\alpha^{v+j}) = \sum_{i=0}^{m-1} \sigma_{0i}a_{v+j,i}.$$

It should be remembered that the coefficients $a_{v+j,i}$ are from the $\{\alpha_j\}$ basis representation of $\alpha^{v+j}$, equation (18).

This last equation dictates the binary constraints that lead to a Boolean-based indicator function which is equal to one only if a single-error constraint for position $v$ is satisfied.

$$\bigcap_{j=0}^{m-1} \overline{\left( \sigma_{1j} + \sum_{i=0}^{m-1} \sigma_{0i}a_{v+j,i} \right)} = \quad (22)$$

$\begin{cases} 1 \text{ IF POSITION } v \text{ IN ERROR} \\ 0 \text{ IF NO SINGLE ERROR} \end{cases}$ $v = N-5, N-4, \ldots, N-1, 0, 1, \ldots, 4.$ The terms appearing in the inner exclusive-or summation, besides the respective $\sigma_{1j}$ components, are determined by the expansion for each $\alpha^{v+j}$ item. A Boolean logic primitive for each position indicator function is shown in FIG. 4. The realization of equation (22) involves one NOR gate where each of its input lines represents the inner exclusive-or summation.

Components that comprise the error detector/corrector 14 are shown in greater detail in FIGS. 3a-3c, with FIG. 3c illustrating the 32-bit implementation. These components are described in detail below. Briefly, the error detector/corrector 14 generates the syndrome lines and signals the occurrence of a nonzero condition. In the correction mode, the syndromes are used to determine the most probable single error position. The error value, syndrome $S_0$, is then subtracted from the selected position. Pipeline registers provide a delay function and compensate for computational delays in the logic. The error locator function 36, shown in FIG. 4, is realized directly in terms of the observed symbol bits $\{\rho_{ji}\}$. The equations for the syndromes components $\{\sigma_{1j}\}$ and $\{\sigma_{1j}\}$, equations (16) and (18), may be substituted directly into equations (22). After appropriate simplification, the error locator function 36 is implemented as 10 output NOR gates having input lines corresponding to exclusive-or summations of the well-defined bit positions from the input symbols. Alternate implementations are also within the scope of the invention.

Having thus described in detail the shortened Reed-Solomon, dual orthogonal basis technique employed by the invention a detailed description of the circuit implementation of this technique is now provided.

FIG. 1 illustrates the implementation of the error detector/corrector device 10 employing a shortened Reed-Solomon (10,8) symbol-based code as described above. The system port 10b of device 10 transmits or receives the 10 m-bit symbols that represent a code word. At the processor port 10a of device 10 there are transmitted or received eight m-bit symbols. The direction of operation of device 10 is externally controlled by the state of a DIRECTION signal that controls the action of tri-state buffers 12a and 12c coupled to the system port 10b and to the processor port 10a, respectively. During operation data flows either from the processor port 10a to the system port 10b, such as during a system memory write operation, or from the system port 10b to the processor port 10a, such as during a system memory read operation.

With m=4, a code word represented by the 10 m (40) bits enters from the system port 10b and is provided to the error detector/corrector 14 where errors in a single nibble (4 bits) are detected and corrected. The eight symbols representing a 32-bit valid datum are subsequently driven to the processor port 10a. Single symbol correcting capability also applies to correcting an erroneous parity symbol. While corrected parity symbols are not normally passed to the processor, which only manipulates eight data symbols, these two parity symbols (14a and 14b) play an important role in implementing the fault-tolerance function, as will be described.

When processor-sourced data is to be encoded, the active path passes through the parity generator 16 where two parity symbols (16a and 16b) are calculated as required by equation (23).

$$P_1 = \sum_{j=1}^{5} D_{N-j}[(\alpha^{-j} + 1)(\alpha + 1)^{-1}] + \qquad (23)$$

$$\sum_{i=2}^{4} D_i[(\alpha^i + 1)(\alpha + 1)^{-1}]$$

$$P_0 = \sum_{j=1}^{5} D_{N-j}[1 + (\alpha^{-j} + 1)(\alpha + 1)^{-1}] +$$

$$\sum_{i=2}^{4} D_i[1 + (\alpha^i + 1)(\alpha + 1)^{-1}]$$

Figure 2A:
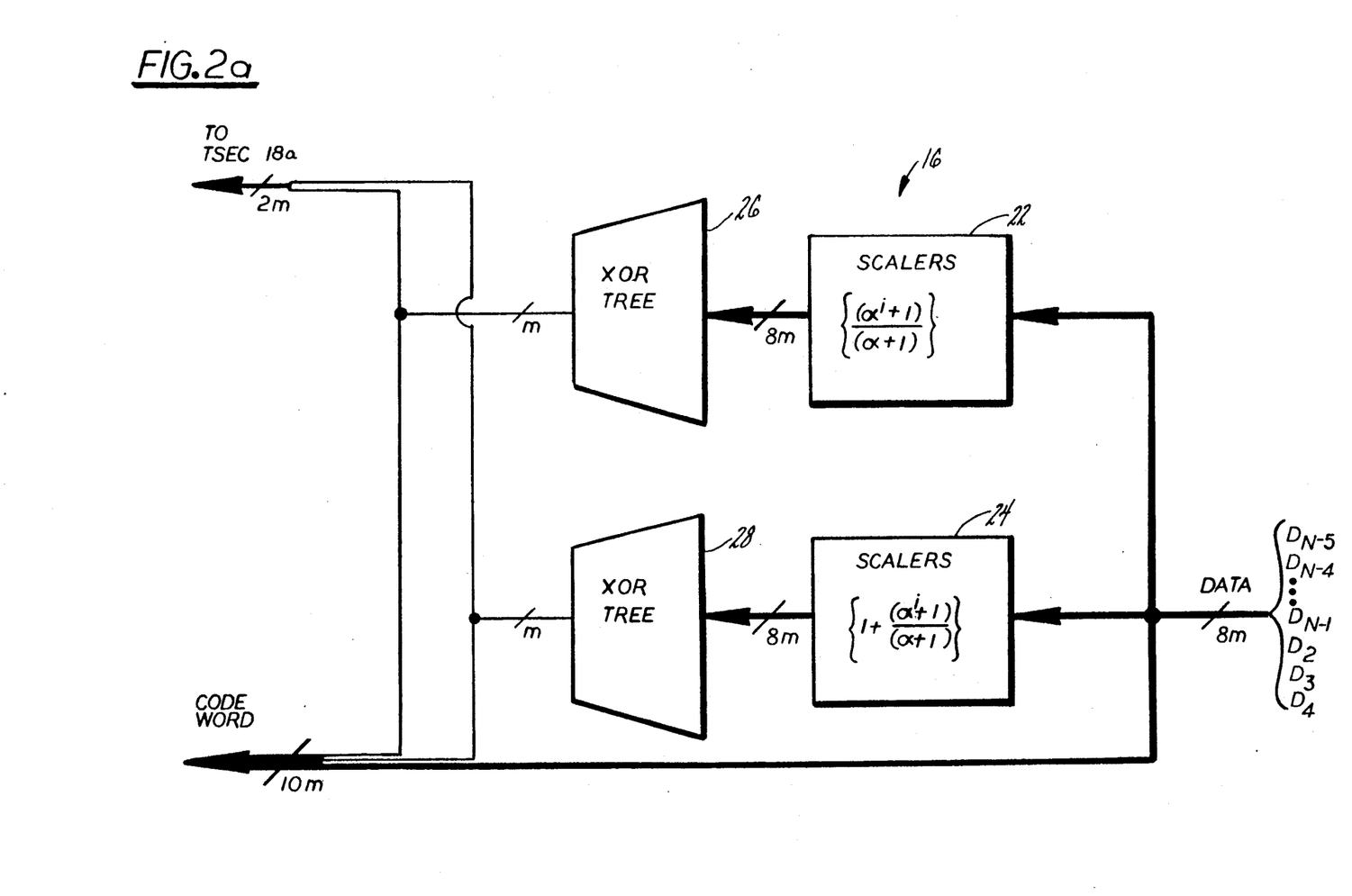
FIG. 2a is a block diagram showing in greater detail a general case of the parity generator subassembly of FIG. 1.
Figure 2B:
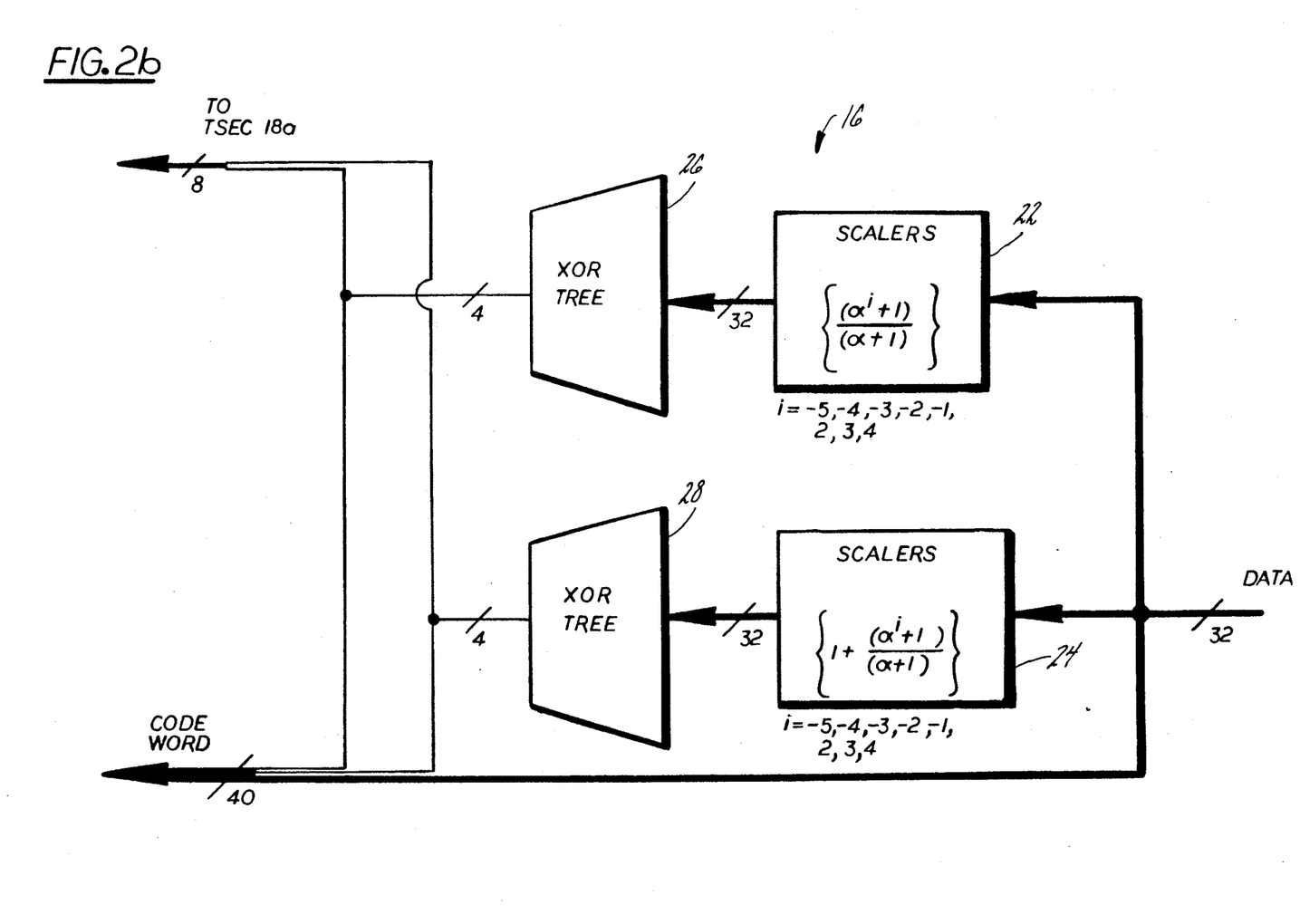
FIG. 2b is a block diagram showing in greater detail the parity generator subassembly of FIG. 1, the parity generator being implemented for a 32-bit data path.

The parity generator 16, shown in greater detail in FIGS. 2a and 2b, includes two groups of finite field scaling multipliers 22 and 24. The multiplicands are fixed by the Reed-Solomon code design as described above. Two XOR trees 26 and 28, each yielding a parity symbol, are used to implement the respective symbol-wide finite field additions necessary in the summations of equations (23). While the use of the outputs from the scalers 22 in the calculation of the lower parity symbol may be accomplished, the extra series delay and the additional complexity of the lower XOR TREE 28 may be unacceptable for many applications. This component can be compressed into a properly connected group of XOR trees, one for each bit of the m-bit parity symbol. In that the parity values are expressed in terms of the dual orthogonal basis, the Trace( function is employed to sift the components that are connected in the XOR trees 26 and 28.

The error detector/corrector 14 of FIGS. 3a and 3c receives from system port 10b 10 m-bit symbols, allegedly representing a valid code word, and calculates the two syndrome symbols $S_0$ and $S_1$ with a syndrome calculation block 14c. Syndrome calculation block 14c includes a group of finite field scalers 30, the output of which feeds an XOR TREE 32 that generates syndrome $S_1$. Syndrome $S_0$ is generated directly by an XOR TREE 34. As previously noted, the scaling and summing operations may be merged into a properly interconnected XOR TREE for each syndrome bit. Both XOR TREEs 32 and 34 include a tap for providing the partial sums $\psi_1$ and $\psi_0$ as shown in (equation (24)).

$$\psi_0 = \sum_{j=1}^{5} R_{N-j} + \sum_{i=2}^{4} R_i \qquad (24)$$

$$\psi_1 = \sum_{j=1}^{5} R_{N-j}\alpha^{-j} + \sum_{i=2}^{4} R_i\alpha^i$$

The correction process thereafter proceeds from the two syndromes using the symbol error locator 36 shown in FIG. 4. The locator 36 output controls decoding selection logic 38 which indicates, when necessary, the symbol to be corrected in accordance with the error value $S_0$. The correction is accomplished by a plurality of bitwise correctors 40, one of which is shown in greater detail in FIG. 3b. The 10 m-bits are preserved in an input register 42 until a correction is accomplished. Error detection logic 46 indicates if the combination of the syndromes is nonzero.

In accordance with an aspect of the invention, internal fault tolerance is obtained by incorporating relatively little additional circuitry. Unlike complex approaches to fault tolerance required for a general cyclic decoder employing iterative algorithms, the fault-tolerance implementation of the invention makes use of a currently inactive internal data path to recompute or regenerate parity values and to thus detect a malfunction in the other, currently active, internal data path. Referring again to FIG. 1 two parity symbols are compared with regenerated parity values by the totally self-checking equality checkers (TSECs) 18a and 18b. Parity symbols are suitably delayed in an associated pipeline register 48a and 48b to give the parity regeneration process time to complete before the comparison function is accomplished.

For example, when correcting an input code word with the detector/corrector 14, the corrected code word is internally routed through buffer 12d (which is always active) to the inactive parity generator 16 which then regenerates parity on the code word. The two parity groups are input to the TSEC 18a which compares the two parity groups to ensure that they are equal. The parity group 14a from the error detector/corrector 14 is suitably delayed by the pipeline register 48a while the parity generator 16 regenerates the parity. In the absence of any failures the two parity patterns will be found to match. Each TSEC 18 passes a "1 out of 2" code output to the totally self-checking code concentrator 20 which generates the error status signal 20a for external circuitry. The assertion of the error status signal 20a indicates an internal malfunction, that is, that the parity generator 16 and the error detector/corrector 14 generated different parity information when presented with presumed identical input data.

Hardware failures that affect the parity generator 16 are sensed by employing the syndrome computation process in the detector/corrector 14. The data that is input to the parity generator 16 from the processor port 10a is also routed through the buffer 12b (which is always active) to the input of the error detector/corrector 14, which operates to regenerate parity on the data. Before being input to TSEC 18b parity values from the parity generator 16 are delayed by the pipeline 48b register to compensate for the time required for parity regeneration in the error detector/corrector 14. Syndrome calculation and parity regeneration by the error detector/corrector 14 is illustrated in FIG. 3c and in further detail in FIG. 5. Regenerated parity symbols are determined in accordance with equations (25) by employing the intermediate partial sum values $\psi_1$ and $\psi_0$ defined earlier. Two relatively small tapped XOR trees 50 and 52 in conjunction with three finite field scaling operations 54, 56 and 58 provide the required parity regeneration function.

$$P_1 = (\psi_1 + \psi_0)(\alpha + 1)^{-1} \quad (25)$$

$$P_0 = (\psi_1 + \alpha\psi_0)(\alpha + 1)^{-1}$$

The TSECs 18a and 18b are implemented according to standard fault tolerance practice. Their respective 1 out of 2 code outputs are further concentrated into a single dual-rail logic signal for external status signal use. The totally self-checking concentrator 20 is used in this regard.

The device 10 also includes circuitry for outputting the contents of the various registers to the data path and circuitry for loading the internal registers from the data path. Thus, a computer system employing the device 10 can be halted, the device 10 register contents read and analyzed, and the system restarted after restoring the register contents. Upon detection of an internal failure the device 10 may be electrically removed from the computer system by disabling a device 10 select input.

The invention may be implemented in a number of suitable hardware embodiments, such as gate arrays and programmable logic devices. One especially suitable embodiment is a field programmable gate array (FPGA). The basic circuit building block in a FPGA is typically much smaller than the basic building block of a Programmable Logic Device (PLD), providing greater flexibility. One consideration is that the chosen implementation be capable of operating at a desired clock rate. For the current embodiment internal synchronous logic is clocked at a 16.67 MHz rate.

Also, currently practical values for m are four and eight. For m=4 there is provided the 40/32 code described above that protects a 32-bit datum against nibble errors with eight bits of parity. However, it should be realized that the teaching of the invention may be employed for protecting more than this number of bits. By example, for m=8 there is provided an 80/64 code that protects a 64-bit datum against byte errors with 16 bits of parity.

Thus, while the invention has been particularly shown and described with respect to a preferred embodiment thereof, it will be understood by those skilled in the art that changes in form and details may be made therein without departing from the scope and spirit of the invention.

What is claimed is:

1. Apparatus for coupling to a plurality of parallel data signal lines that convey simultaneously presented parallel digital information for detecting an occurrence of an error in the parallel digital information and for correcting the error, comprising:

means coupled to a first plurality of parallel data signal lines for generating in a single step, when active, a first group of parallel parity signals that is a function of a logical state of the first plurality of parallel data signal lines and for providing the first group of parallel parity signals and the first plurality of parallel data signal lines for combining into a second plurality of parallel signal lines;

means coupled to the second plurality of parallel signal lines for decoding, in a single step, when active, the second plurality of parallel signal lines to determine if one or more of the parallel signal lines is in error; and means coupled to the second plurality of parallel signal lines, and responsive to the operation of the decoding means, for identifying and correcting at least one erroneous signal line on the second plurality of signal lines and for providing the corrected signal line to the first plurality of parallel signal lines; wherein all of the above said means performs their functions with Boolean operations, and the generating means includes means for validating the operation of the decoding means at a time when the decoding means is active and wherein the decoding means includes means for validating the operation of the generating means at a time when the generating means is active.

2. Apparatus as set forth in claim 1 wherein the first plurality of parallel data signal lines is partitioned into eight symbols of m bits and wherein for each symbol of m bits the first group of parallel parity signal lines is comprised of two symbols of m bits, and wherein m=4.

3. Apparatus as set forth in claim 1 wherein the first plurality of parallel data signal lines is partitioned into eight symbols of m bits and wherein for each symbol of m bits the first group of parallel parity signal lines is comprised of two symbols of m bits, and wherein m=8.

4. Apparatus as set forth in claim 1, wherein the means for validating the operation of the generating means, when the generating means is active, produces a second group of parallel parity signals that is a function of a logical state of the second plurality of parallel signal lines, and wherein the apparatus further comprises means for comparing the first group of parallel parity signals to the second group of parallel parity signals to determine if they are equal and, if the first and the second group of parallel parity signals are not equal, for generating an error signal.

5. Apparatus as set forth in claim 4 wherein the means for validating the operation of the decoding means, when the decoding means is active, produces the first group of parallel parity signals that is a function of the logical of the first plurality of the parallel data signal lines as decoded by the decoding means, and wherein the apparatus further comprises means for comparing the first group of parallel parity signals to the second group of parallel parity signals to determine if they are equal and, if the first and the second groups of parallel parity signals are not equal, for generating the error signal.

6. Apparatus as set forth in claim 1 wherein the generating means includes means for generating the first group of parallel parity signals in accordance with a shortened Reed-Solomon code.

7. Apparatus as set forth in claim 6 wherein the decoding means includes means for decoding the second plurality of parallel signal lines in accordance with a dual orthogonal basis technique.

8. Apparatus for coupling in series with a parallel data bus and interposed between a data processor and circuitry accessed by the data processor, the apparatus detecting an occurrence of an error on the parallel data bus and correcting the error, comprising:

means coupled to parallel data bus signal lines for encoding in a parallel single step operation, when the data processor is sourcing simultaneously presented parallel data to the parallel data bus, a plurality of parallel parity signals in accordance with a Reed-Solomon code, the encoding means including means for simultaneously driving sourced parallel data together with the encoded parallel parity signals to the parallel data bus for transmission to circuitry accessed by the data processor;

means coupled to the parallel data bus signal lines for decoding in a parallel single step operation, when the data processor is sinking data from the parallel data bus, the parallel data bus in conjunction with associated previously encoded parallel parity signals to determine if an error exists thereon, the decoding means including means for simultaneously decoding the parallel data bus together with the parallel parity signals in accordance with a dual orthogonal basis technique;

means coupled to the parallel data bus signal lines, and in response to the operation of the decoding means, for simultaneously detecting, identifying and correcting one or more erroneous parallel data bus signal lines for supplying corrected data to the data processor;

wherein said encoding, said decoding, and said detecting, identifying and correcting means all perform their functions with Boolean operations, and the encoding means includes means for validating the operation of the decoding means at a time when the decoding means is active and wherein the decoding means includes means for validating the operation of the encoding means at a time when the generating means is active.

9. Apparatus as set forth in claim 8 wherein the encoding means includes means for validating the operation of the decoding means at a time when the data processor is sinking data, and wherein the decoding means includes means for validating the operation of the encoding means at a time when the data processor is sourcing data.

10. Apparatus as set forth in claim 8 wherein the parallel data bus is partitioned into eight parallel symbols of m bits and wherein for each group parallel symbol of m bits an associated parity signal is comprised of two symbols of m bits, and wherein m=8.

11. Apparatus as set forth in claim 8 wherien the parallel data bus is partitioned into eight parallel symbols of m bits and wherein for each group parallel symbol of m bits an associated parity signal is comprised of two symbols of m bits, and wherein m=8.

12. Apparatus as set forth in claim 8 wherein the decoding means includes means for calculating a value of a first parallel syndrome and a second parallel syndrome in a parallel single step operation as a function of the parallel data bus and the associated previous encoded parallel parity signals, and wherein the identifying and correcting means includes means for comparing the first parallel syndrome and second parallel syndrome to zero to determine if the parallel data bus is in error, the identifying and correcting means further including means responsive to a second parallel single operation of the detecting means for decoding the first parallel syndrome and the second parallel syndrome for selecting one of a plurality of parallel data bus parallel symbols having an error.

13. Apparatus as set forth in claim 12 wherein each of the parallel data bus is comprised of four bits.

14. Apparatus as set forth in claim 12 wherein for each of the parallel symbols the identifying and correcting means comprises a parallel plurality of single bit corrector means, each of the corrector means being coupled to a single bit of the parallel data bus and to a corresponding bit of the first parallel syndrome, and responsive to the operation of the selecting means, providing a corrected data bit at an output thereof.

15. A method for detecting an occurrence of an error in digital information and for correcting the error, comprising the steps of:

generating, in response to a multi-bit datum output by a data processing means, a parity signal having a value that is a function of a logical state of the bits of the datum;

associating the parity signal with the datum;

decoding, in response to a multi-bit datum to be input to the data processing means, the datum and the associated parity signal to determine if one or more of the bits is in error;

identifying bits, if any, that are in error;

correcting the erroneous bits; and providing the correct datum to the data processing means while also providing a correct parity signal associated therewith;

wherein the step of generating includes a step of validating the correctness of the generated parity signal which further comprises the steps of regenerating the parity signal and comparing the generated parity signal to the regenerated parity signal to determine if they are logically equal one to another; and wherein the step of providing includes a step of validating the correctness of the provided parity signal which further comprises the steps of regenerating the provided parity signal and comparing the provided parity signal to the regenerated parity signal to determine if they are logically equal one to another.

16. A method as set forth in claim 16 wherein the steps of comparing each include a step of asserting an error signal line to indicate when the result of the comparison indicates that the compared values are not logically equal.

17. A method for detecting an occurrence of an error in parallel digital information and for correcting the error, comprising the steps of:

generating, in response to a parallel multi-bit data output by a data processing means, a parallel parity signal having a value that is determined in accordance with a shortened Reed-Solomon code and as a function of a logical state of the parallel bits of the data;

associating the parallel parity signal in parallel with the data;

decoding in accordance with a dual orthogonal basis, in response to a parallel multi-bit data to be input to the parallel processing means, the parallel data and the associated parallel parity signal to determine if one or more of the bits is in error;

identifying bits, if any, that are in error;

correcting the erroneous bits; and providing the correct parallel data to the data processing means while also providing a correct parallel parity signal wherein all steps of said method are performed using Boolean operations.

18. A method set forth in claim 17 wherein the step of generating includes a step of validating the correctness of the generated parallel parity signal which further comprises the steps of regenerating the parallel parity signal and comparing the generated parallel parity signal to the regenerated parallel parity signal to determine if they are logically equal one to another; and wherein the step of providing t he correct parallel data includes a step of validating the correctness of the provided parallel parity signal which further comprises the steps of regenerating the provided parallel parity signal and comparing the provided parallel parity signal to the regenerated parallel parity signal to determine if they are logically equal one to another.

19. A method as set forth in claim 17 wherein the step of decoding includes the steps of:
- calculating a value of a first parallel syndrome and a second parallel syndrome in a parallel single step operation on the logical state of the parallel data and the parallel parity signal;
- comparing the first parallel syndrome and second parallel syndrome to zero to determine if the parallel data is correct;
- if the parallel data is found to be in error, decoding the first and second parallel syndrome values for identifying an erroneous portion of the parallel data; and
- combining the erroneous portion of the parallel data with an associated portion of one of the parallel syndromes to correct the erroneous portion of the parallel data.

20. Apparatus for coupling to a plurality of signal lines that convey digital information for detecting an occurrence of an error in the digital information and for correcting the error, comprising:
- means coupled to a first plurality of the signal lines wherein the first plurality of signal lines are partitioned into eight groups of m bits, where m = 4, for generating, when active, a first signal comprised of two m bits for each group that is a function of a logical state of the first plurality of the signal lines and for providing the first signal to a second plurality of the signal lines;
- means coupled to the second plurality of signal lines for decoding, when active, the first and the second plurality of signal lines to determine if one or more of the signal lines is in error; and
- means coupled to the second plurality of signal lines, and responsive to the operation of the decoding means, for identifying and correcting an erroneous signal line of the second plurality of signal lines; wherein
- the generating means includes means for validating the operation of the decoding means at a time when the decoding means is active and wherein the decoding means includes means for validating the operation of the generating means at a time when the generating means is active.

21. Apparatus for coupling to a plurality of signal lines that convey digital information for detecting an occurrence of an error in the digital information and for correcting the error, comprising:
- means coupled to a first plurality of the signal lines wherein the first plurality of signal lines are partitioned into eight groups of m bits, where m = 8, for generating, when active, a first signal comprised of two m bits for each group that is a function of a logical state of the first plurality of the signal lines and for providing the first signal to a second plurality of the signal lines;
- means coupled to the second plurality of signal lines for decoding, when active, the first and the second plurality of signal lines to determine if one or more of the signal lines is in error; and
- means coupled to the second plurality of signal lines, and responsive to the operation of the decoding means, for identifying and correcting an erroneous signal line of the second plurality of signal lines; wherein
- the generating means includes means for validating the operation of the decoding means at a time when the decoding means is active and wherein the decoding means includes means for validating the operation of the generating means at a time when the generating means is active.

22. A method for detecting an occurrence of an error in digital information and for correcting the error, comprising the steps of:
- generating, in response to a multi-bit datum output by a data processing means, a parity signal having a value that is determined in accordance with a shortened Reed-Solomon code and as function of a logical state of the bits of the datum, and validating the correctness of the generated parity signal which further comprises the steps of regenerating the parity signal and comparing the generated parity signal to the regenerated parity signal to determine if they are logically equal one to another; associating the parity signal with the datum;
- decoding in accordance with a dual orthogonal basis, in response to a multi-bit datum to be input to the processing means, the datum and the associated parity signal to determine if one or more of the bits is in error;
- identifying bits, if any, that are in error;
- correcting the erroneous bits; and
- providing the correct datum to the data processing means while also providing a correct parity signal and while further validating the correctness of the provided parity signal which further comprises the steps of regenerating the provided parity signal and comparing the provided parity signal to the regenerated parity signal to determine if they are locally equal one to another.

23. Apparatus for coupling in series with a data bus and interposed between a data processor and circuitry accessed by the data processor, the apparatus detecting an occurrence of an error on the data bus and correcting the error, comprising
- means coupled to data bus signal lines for encoding, when the data processor is sourcing data to the data bus, a plurality of parity signals in accordance with a Reed-Solomon code, the encoding means including means for driving sourced data and the encoded parity signals to the data bus for transmission to circuitry accessed by the data processor, and wherein the data bus is partitioned into eight groups of m bits and wherein for each group of m bits an associated parity signal is comprised of two m bits, where m=4;
- means coupled to the data bus signal lines for decoding, when the data processor is sinking data from the data bus, the data bus in conjunction with associated previously encoded parity signals to determine if an error exists thereon, the decoding means including means for decoding the data bus and the parity signals in accordance with a dual orthogonal basis technique; and
- means coupled to the second plurality of signal lines, and responsive to the operation of the decoding means, for detecting, identifying and correcting one or more erroneous data bus signal lines for supplying corrected data to the data processor.

24. Apparatus for coupling in series with a data bus and interposed between a data processor and circuitry accessed by the data processor, the apparatus detecting an occurrence of an error on the data bus and correcting the error, comprising means coupled to data bus signal lines for encoding, when the data processor is sourcing data to the data bus, a plurality of parity signals in accordance with a Reed-Solomon code, the encoding means including means for driving sourced data and the encoded parity signals to the data bus for transmission to circuitry accessed by the data processor, and wherein the data bus is partitioned into eight groups of m bits and wherein for each group of m bits an associated parity signal is comprised of two m bits, where $m=8$;

means coupled to the data bus signal lines for decoding, when the data processor is sinking data from the data bus, the data bus in conjunction with associated previously encoded parity signals to determine if an error exists thereon, the decoding means including means for decoding the data bus and the parity signals in accordance with a dual orthogonal basis technique; and means coupled to the second plurality of signal lines, and responsive to the operation of the decoding means, for detecting, identifying and correcting one or more erroneous data bus signal lines for supplying corrected data to the data processor.

* * * * *